(12) United States Patent
Hummler

(10) Patent No.: US 6,734,059 B1
(45) Date of Patent: May 11, 2004

(54) SEMICONDUCTOR DEVICE WITH DEEP TRENCH ISOLATION AND METHOD OF MANUFACTURING SAME

(75) Inventor: Klaus Hummler, Apex, NC (US)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 10/299,269

(22) Filed: Nov. 19, 2002

(51) Int. Cl.[7] .......................................... H01L 21/8242
(52) U.S. Cl. ..................... 438/243; 438/239; 438/241; 438/242; 438/268; 438/244; 438/248; 438/387; 438/391
(58) Field of Search ................................. 438/239, 241, 438/242, 243, 268, 244, 248, 387, 391

(56) References Cited

U.S. PATENT DOCUMENTS

| | | |
|---|---|---|
| 6,326,275 B1 | 12/2001 | Harrington et al. |
| 2002/0102778 A1 | 8/2002 | Clevenger et al. |
| 2002/0196651 A1 * | 12/2002 | Weis ........................ 365/100 |
| 2003/0143809 A1 * | 7/2003 | Hummler ................... 438/270 |

OTHER PUBLICATIONS

A Novel DRAM Technology Using Dual Spacer and Mechanically Robust Capacitor for 0.12μm DRAM and Beyond, Jaegoo Lee, Jinwoo Lee, Kwanhyeob Koh, Kyuhyun Lee, Changhyun Cho, Gitae Jeong, Hongsik Jeong, Taeyoung Chung and Kinam Kim. Retrieved from the Internet: <www.eurotraining.net/ESSCIRC–2001/essderc–2001/data/62.pdf> on Aug. 14, 2002.

2.4F[2] Memory Cell Technology With Stacked–Surrounding Gate Transistor (S–SGT) DRAM, Tetsuo Endoh, Masahiko Suzuki, Hiroshi Sakuraba, and Fujio Masuoka, IEEE Transactions on Electron Devices, vol. 48, No. 8, Aug. 2001.

* cited by examiner

*Primary Examiner*—Long Pham
(74) *Attorney, Agent, or Firm*—Lerner, David, Littenberg, Krumholz & Mentlik, LLP

(57) ABSTRACT

A semiconductor device and method of making the same is provided having enhanced isolation between the bit line contact and the gate region of the semiconductor device. A gate conductor spacer and a recess fill material provide the enchanced isolation. The recess fill material substantially fills a recess defined by the gate conductor spacer and has a different composition than the gate conductor spacer.

9 Claims, 13 Drawing Sheets

US 6,734,059 B1

SEMICONDUCTOR DEVICE WITH DEEP TRENCH ISOLATION AND METHOD OF MANUFACTURING SAME

BACKGROUND OF THE INVENTION

Semiconductor devices are employed in various systems in a wide variety of applications. An important type of semiconductor device used as a memory is the dynamic random access memory ("DRAM"). DRAM is extensively used for memory in computers. A single DRAM memory cell may include a capacitor and a transistor, each formed in a semiconductor substrate. The capacitor stores a charge representing a data value. The transistor allows the data valve to be written to the capacitor, read from the capacitor or refreshed. A series of DRAM memory cells is typically arranged in an array.

More DRAM cells can be arranged onto a semiconductor chip by reducing the surface area of the capacitor and/or the transistor thus resulting in greater memory capacity for the chip. A method of minimizing the surface area of a DRAM cell is to construct the components vertically, i.e., where a semiconductor device includes components formed in several layers. One way to accomplish such vertical construction involves forming a trench in a semiconductor substrate. For example, a dielectric film may be deposited on the sides of the trench and layers of conductive, semiconductive and/or insulative material are then deposited in the trench. Each layer may be etched so as to have a desired shape and/or size. The steps of etching and depositing new material may be repeated until the desired component, e.g., a vertical DRAM memory cell is formed.

Preferably, the capacitor is fabricated in a lower portion of the trench and at least part of the transistor is formed over the capacitor in an upper portion of the trench. The transistor may comprise source, gate and drain regions where the source is connected to a storage node of the capacitor, the drain is connected to a bit line, and the gate connected to a word line. FIG. 1 illustrates a conventional DRAM memory cell 400 including a capacitor 410 and a transistor 420. The capacitor 410 includes a first electrode 412 and a second electrode 414. Typically, a dielectric material (not shown) is disposed between the electrodes. The transistor 420 includes a source (or drain) 422 connected to the second electrode 414. The transistor 420 also includes a drain (or source) 424 connected to a bit line 432, as well as a gate 426 connected to a word line 430. The data may be refreshed, read from, or written to the capacitor 410 of each memory cell of the memory array by the bit lines 432 and the word lines 430.

As an example, the memory cell array may be arranged in rows and columns. A row may be connected to one bit line 432, and a column may be connected to one word line 430. A specific memory cell in the array is accessed by selecting the appropriate bit line 432 and word line 430. The data may be refreshed, read from, or written to the capacitor by applying appropriate voltages to the bit line 432 and/or the word line 430.

The bit line 432 may be connected to the drain (or source) 424 by a bit line contact. The word line 430 may be connected to the gate 426 by a word line contact, or the gate 426 itself may serve as the word line 430. As the surface area of the memory cell decreases, the bit line contact and the gate/word line contact may be positioned closer together. By way of example only, using current fabrication techniques, the bit line contact and the gate/word line contact may be separated by 20–30 nm. The closer positioning of the bit line contact and the gate/word line contact may cause a short circuit or induce cross-talk between the components. This problem may occur due to device fabrication errors such as misalignment, over-etching or structural defects. For example, material layers are typically patterned by depositing a masking layer over the material layer and patterning the masking layer to expose portions of the material layer which are removed while other portions are covered. Then, a new material layer may be deposited and similarly patterned. If the masking layers are misaligned with respect to one another, the upper material layer may be located incorrectly, i.e., misaligned, thereby damaging or rendering the semiconductor device inoperable. Similarly, overetching an exposed portion of the layer may damage the material layer or another layer and may lead to a short circuit between nearby components. To prevent such short circuits or cross-talk between the bit line contact and the gate/word line contact, isolation may be employed.

A known isolation technique requires a first spacer in the trench followed in a later processing step with another spacer surrounding the gate region. The first spacer is commonly referred to as a deep trench spacer, DT top spacer or DT spacer. FIGS. 2 to 4 illustrate an example of a typical nitride spacer isolation process. As will become evident, such nitride spacer isolation may not prevent a short circuit or cross-talk in many situations.

Prior to the step illustrated in FIG. 2, a trench was formed in semiconductor substrate 100 having a surface 102. A trench top oxide ("TTO") 110 was formed in a lower portion of the trench to, e.g., isolate a capacitor (not shown) within the trench from a transistor which will be formed in an upper portion of the trench. The capacitor is commonly known as a trench capacitor. A gate oxide 116 lines sidewalls 114 of the trench. On either side of the sidewalls 114 are source (drain) regions 144. Within the trench is a gate material 118 and a gate stud 130. A gate conductor 150 connects to the gate stud 130, and is protected by a silicate 172 and a nitride cap 174. A screen oxide 140 is disposed over the source (drain) regions 144. The screen oxide 140 also partly encloses a nitride spacer 142. A nitride liner 146 is formed over the screen oxide 140 and the nitride spacer 142. An array top oxide ("ATO") 148 is formed over the nitride liner 146. The processes of forming these elements are well known to those skilled in the art.

FIG. 2 illustrates the result of a processing step after the gate conductor 150, the silicate 172 and the nitride cap 174 have been deposited over the gate stud 130, the nitride spacer 142 and the ATO 148. The gate conductor 150, the silicate 172 and the nitride cap 174 are patterned and etched to a desired shape and size. As part of the etching process, a portion of the gate stud 130 is removed, typically by an anisotropic etch selective to oxide and nitride, leaving a recess 152 in the gate region.

After the recess 152 is formed, a gate spacer 160, also known as a gate conductor spacer or GC spacer is formed, as shown in FIG. 3. The gate spacer 160 is typically a nitride that is deposited over the wafer and covers the exposed surfaces. During deposition, the gate spacer 160 folds back on itself as it fills the recess 152. Because of the nature of the deposition process, a seam or void 162 is typically formed as well.

FIG. 4 illustrates a further fabrication step after a bit line 178 is formed. An isolating material 176, such as borophosphosilicate glass (BPSG), separates the device from other components on the wafer, such as the bit line 178. The bit line 178 connects to the source region 144 through a bit line contact 180. During processing steps such as spacer etchback, it is difficult to maintain a uniform thickness of the gate spacer 160. Furthermore, the seam or void 162 enhances the potential for over etching the bit line contact 180, thus shorting the bit line contact 180 to the device. In particular, while the bit line etching process is typically selective to nitride, i.e., the process etches other materials more rapidly than it etches nitride, the process may rapidly etch through the seam or void 162 and provide direct contact ("punch-through") between the bit line contact 180 and the gate material 118.

Therefore, a need exists for an improved isolation technique which provides more robust protection. The improved isolation technique of the present invention eliminates the deep trench spacer process of prior techniques. The present invention provides wider misalignment protection between the gate conductor and the trench, and avoids punch-through of the bit line contact to the device.

SUMMARY OF THE INVENTION

In accordance with an embodiment of the present invention, a method of fabricating a semiconductor device is provided. The method includes first forming a trench having sidewalls in a semiconductor substrate. Fill material is then deposited within the trench. Then, a section of the fill material is removed to form a recess having a desired depth. Then, a spacer layer of a first material is formed to line the recess. Next, a remaining portion of the lined recess is substantially filled with a second material layer. The spacer layer and the second material layer isolate a first region of the semiconductor device from a second region of the semiconductor device. Preferably, the spacer layer is a nitride and the second material layer is an oxide.

In accordance with another embodiment of the present invention, a method of fabricating a semiconductor device is provided such that a spacer and a recess fill material provide isolation between a gate material and other portions of the semiconductor device. The method includes forming a trench having sidewalls in a semiconductor substrate and forming a trench oxide within the trench. An oxide is formed along a first portion of the sidewalls between the trench oxide and an upper surface of the trench. Then, a gate material is deposited in the trench. The gate material has a surface remote from the trench oxide, and the gate material overlies the trench oxide. The gate material is partly enclosed by the gate oxide. Next, a gate conductor is deposited over the gate material. Pre-selected portions of the gate conductor and sections of the gate material are etched to form a recess having a desired depth. The recess is then lined with a spacer, which preferably comprises a nitride. The remaining portion of the recess is substantially filled with a recess fill material, which is preferably an oxide. Regardless of whether the spacer is a nitride and the recess fill material is an oxide, the spacer and the recess fill material comprise different materials.

In accordance with another embodiment of the present invention, a semiconductor device is provided, including a capacitor and a transistor. The capacitor is formed in a semiconductor substrate and the transistor is disposed adjacent to the capacitor. The transistor includes a source region electrically connected to a bit line contact, a drain region in electrical contact with the capacitor, a gate region electrically connected to a word line and a gate conductor spacer lining a portion of the gate region. The gate conductor spacer includes a recess. A recess fill material substantially fills the recess. The recess fill material has a composition different from the gate conductor spacer. The gate conductor spacer and the recess fill material are operable to prevent electrical contact between the bit line contact and the gate region.

In accordance with yet another embodiment of the present invention, a semiconductor device is provided, including a first material, a second material, a spacer material and a further material layer. The first material is formed in a semiconductor substrate and has an aperture therein. The spacer material is disposed over at least a portion of the first material, including the aperture. The spacer material does not completely fill the aperture, but leaves a recess remaining. The further material layer spans the recess and substantially fills the recess. The further material layer and the spacer material comprise different materials. The second material is partly disposed over the first material, and the spacer material and the recess-filling further material layer provide isolation between the first material and the second material. Preferably, the spacer material is a nitride and the further material layer is an oxide.

The foregoing aspects, features and advantages of the present invention will be further appreciated when considered with reference to the following description of the preferred embodiments and accompanying drawings, wherein like numerals indicate like references.

DETAILED DESCRIPTION

Figure 1:
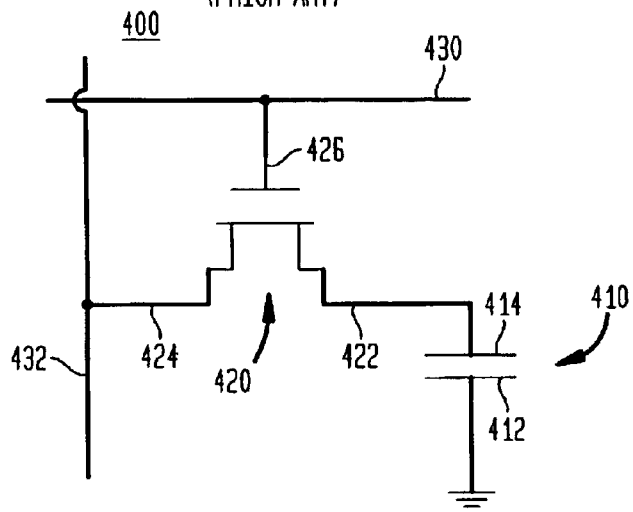
FIG. 1 is an illustration of conventional DRAM memory cell.
Figure 2:
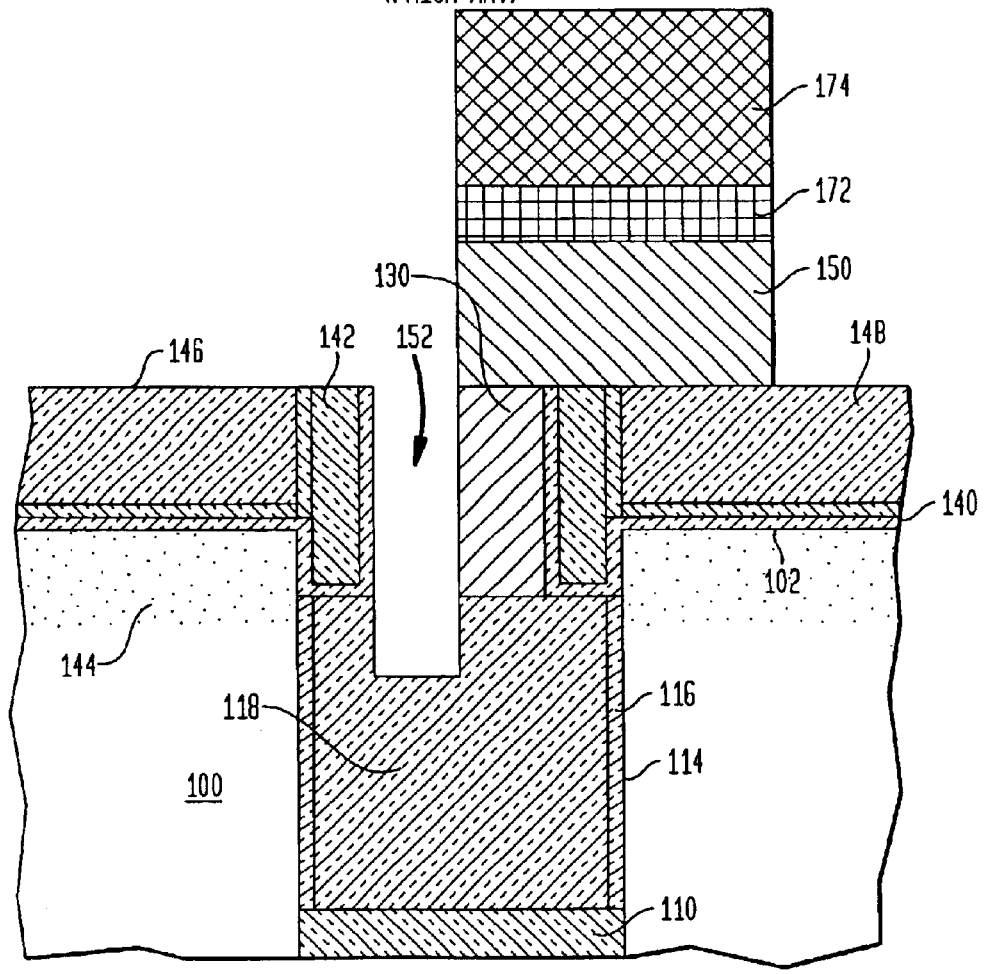
FIG. 2 is a schematic cross-sectional illustration at a step in a process of fabricating a prior art semiconductor device.
Figure 3:
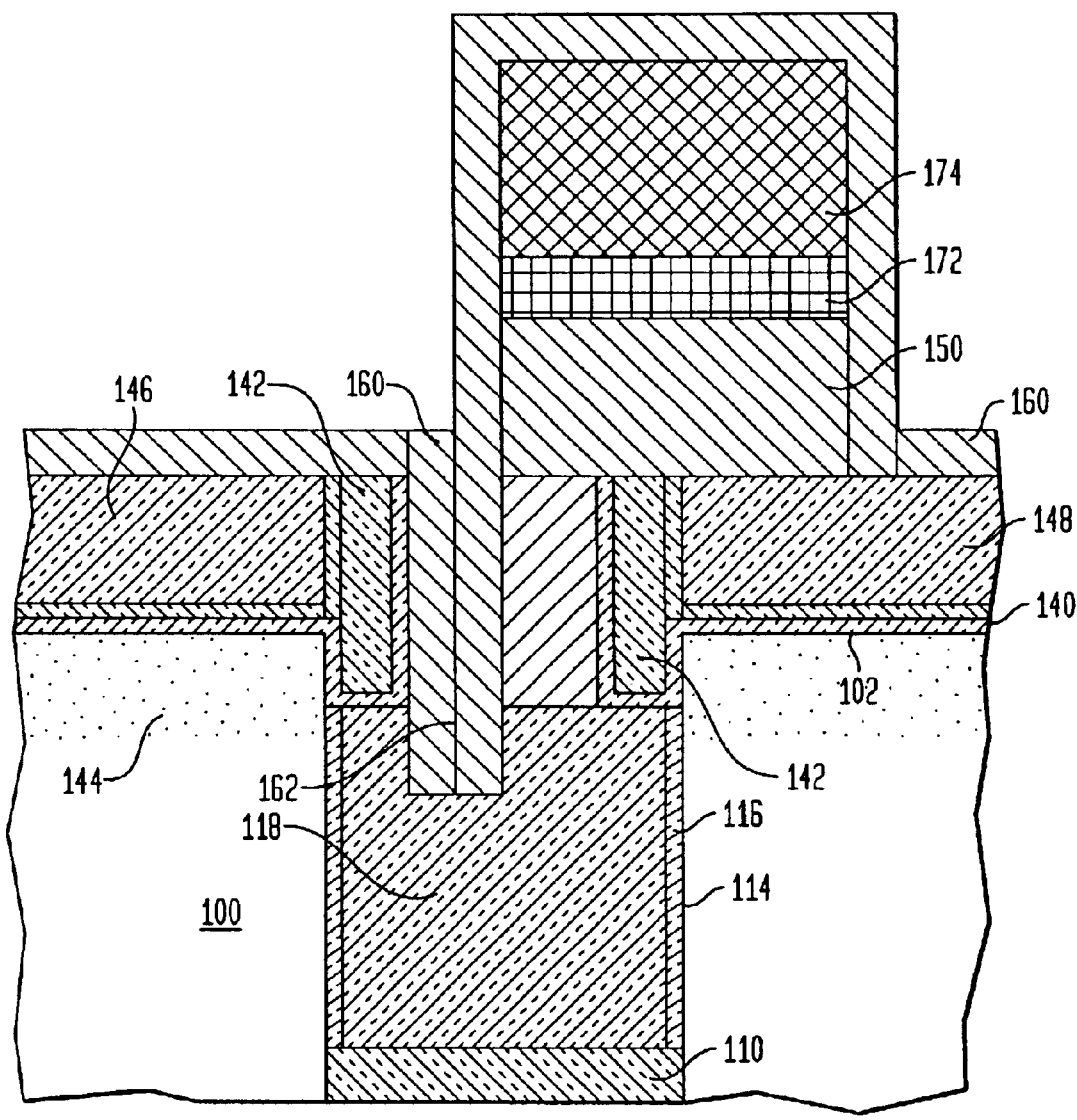
FIG. 3 is a schematic cross-sectional illustration at a subsequent step in a process of fabricating a prior art semiconductor device.
Figure 4:
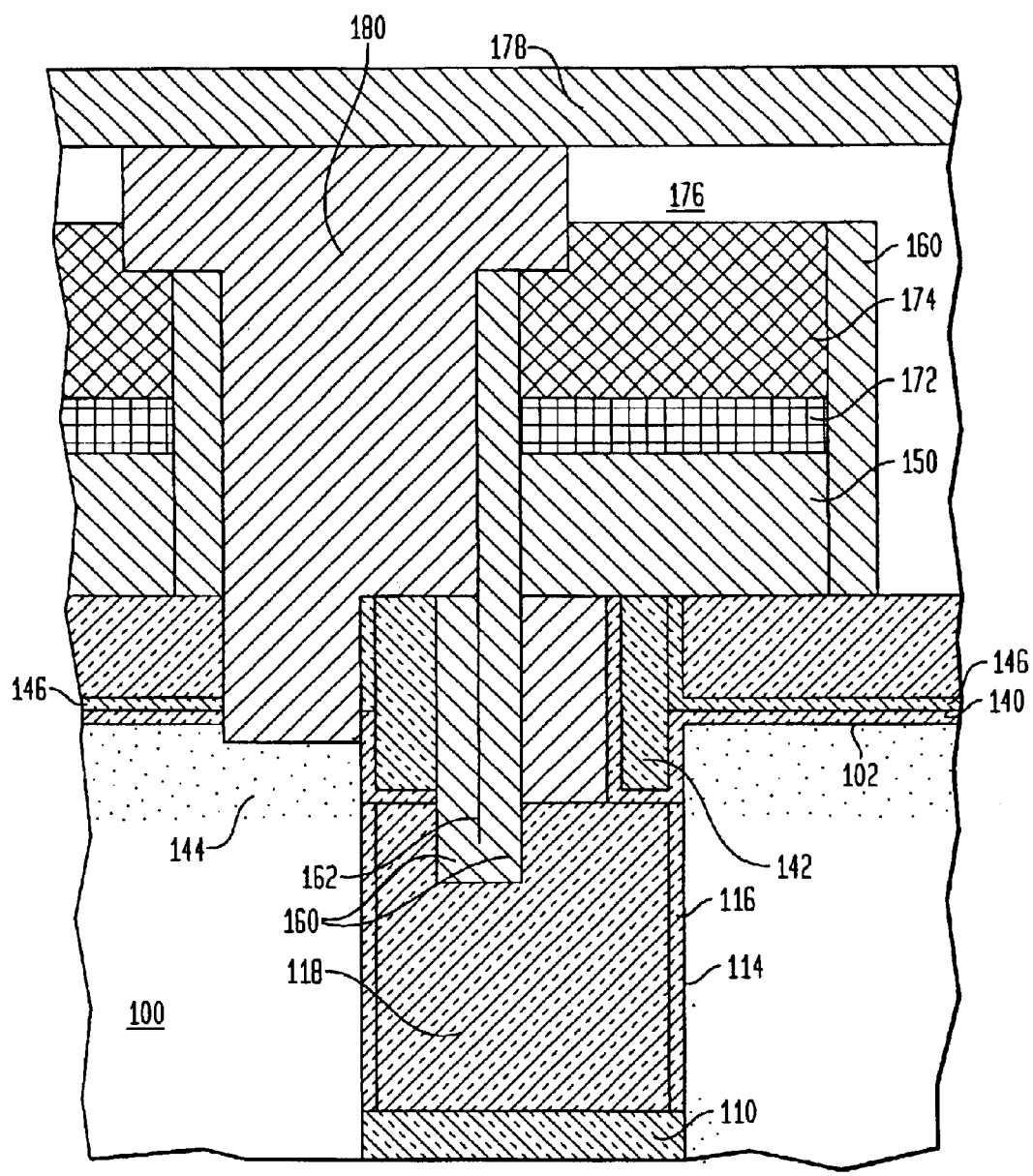
FIG. 4 is a schematic cross-sectional illustration of a prior art semiconductor device at a later fabrication stage.
Figure 5:
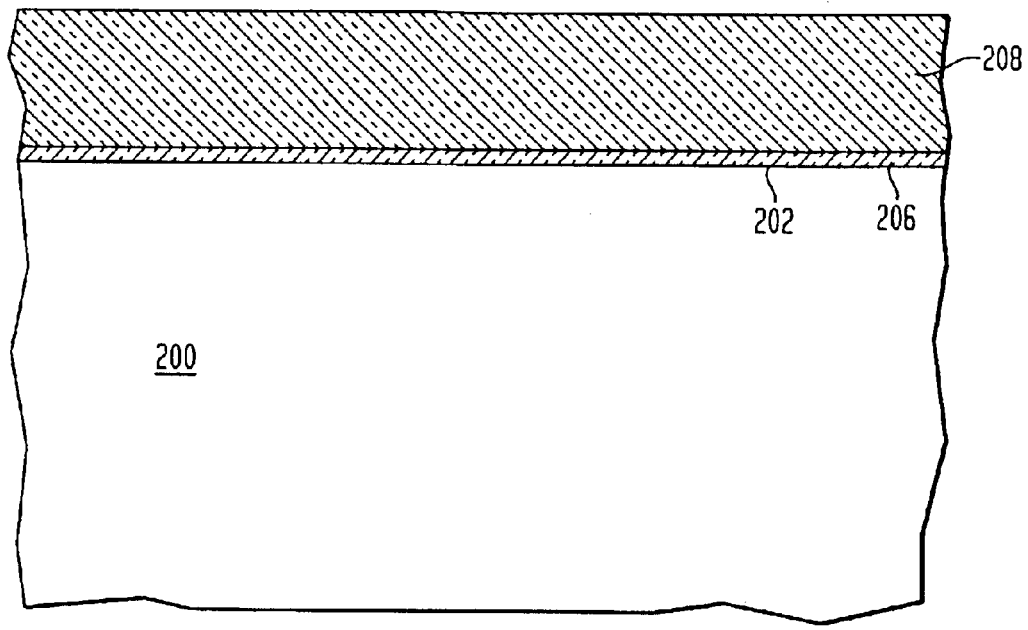
FIG. 5 is a schematic cross-sectional illustration at a step in a present process of fabricating a semiconductor device.

FIG. 5 illustrates a step in a present fabrication process, wherein a pad oxide 206 and a pad nitride 208 have been deposited on surface 202 of a semiconductor substrate 200. The substrate 200 is the backbone of a wafer that can be used to form many semiconductor devices. The substrate 200 is preferably silicon (Si), though various other materials may be employed, including, but not limited, to gallium arsenide (GaAs), indium phosphide (InP), and silicon carbide (SiC). The pad oxide 206 and the pad nitride 208 may be used to protect certain areas of the substrate 200 during fabrication steps such as etching and dopant implantation.

Figure 6:
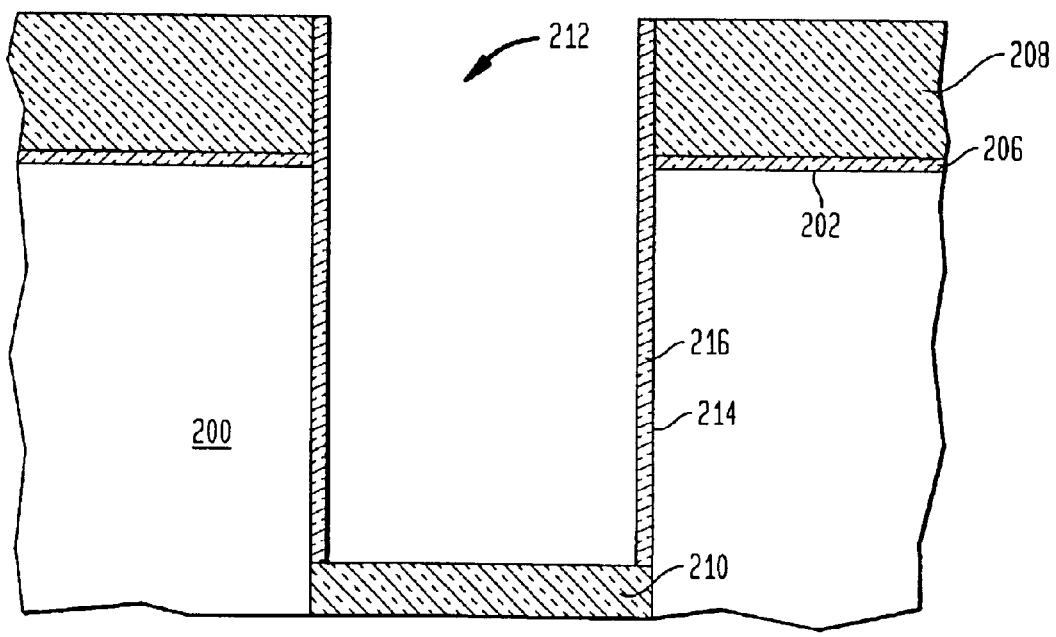
FIG. 6 is a schematic cross-sectional illustration at a subsequent step in a present process of fabricating a semiconductor device.

In FIG. 6, a trench 212 having sidewalls 214 is etched or otherwise formed through the pad nitride 208, the pad oxide 206 and into the substrate 200. As shown in the figure, a barrier, TTO 210 is formed in a lower portion of the trench 212. A gate oxide 216 lines the sidewalls 214 of the trench 212.

Figure 7:
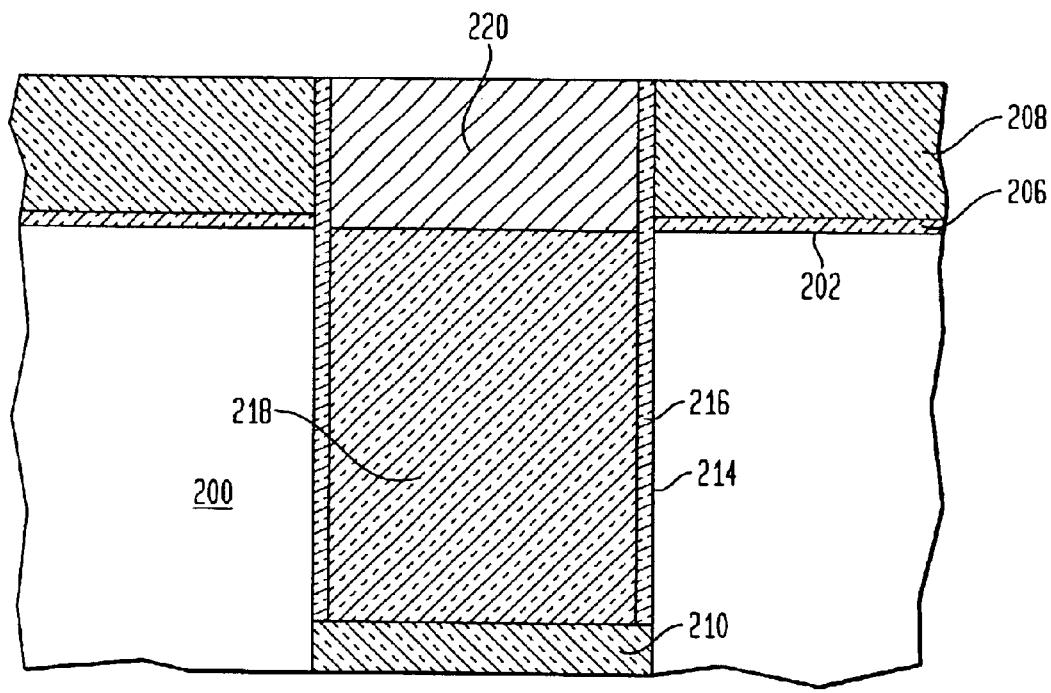
FIG. 7 is a schematic cross-sectional illustration at a further step in a present process of fabricating a semiconductor device.

FIG. 7 illustrates a subsequent processing step after a gate material 218 has filled the trench. The gate material 218 may be poly-crystalline silicon ("poly-Si"). The poly-Si may be doped by, e.g., arsenic or phosphorous. The gate oxide 216 will isolate the gate material 218 from the surrounding substrate 200. A gate stud 220 may be formed over the gate material 218. The gate stud 220 is preferably the same composition as the gate material 218. The gate stud 220 may be formed concurrently with the gate material 218 or at a later processing step. As shown in the figure, the gate stud 220 has been planarized to leave it relatively level with the surface of the pad nitride 208. A process such as chemical mechanical polishing ("CMP") is typically used to planarize such surfaces.

Figure 8:
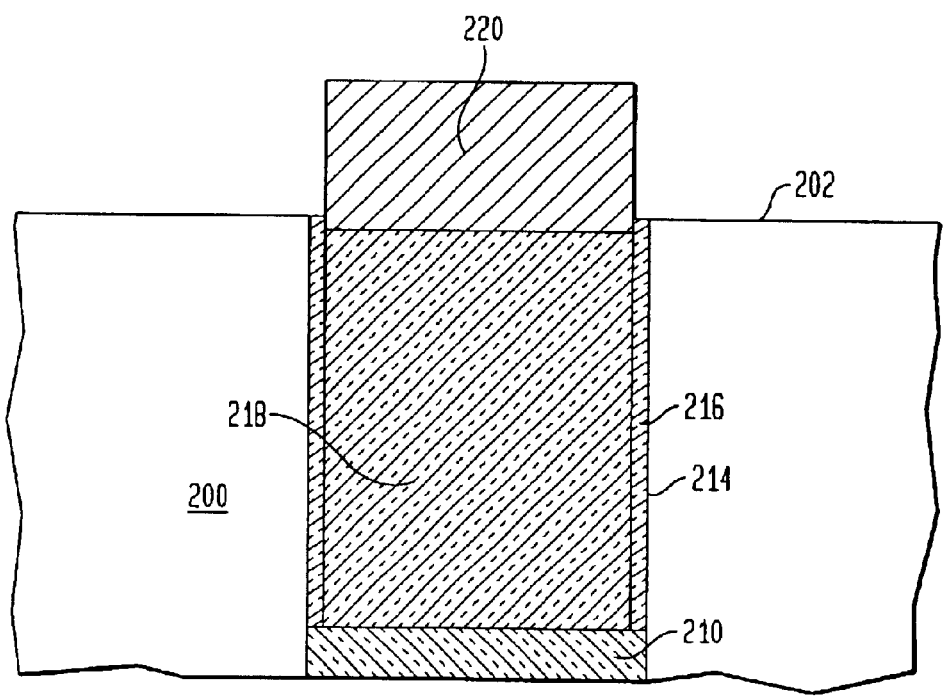
FIG. 8 is a schematic cross-sectional illustration at a step in a present process of fabricating a semiconductor device.

FIG. 8 is a schematic cross-sectional illustration of a subsequent step in the process of forming a semiconductor device in a substrate 200. The pad oxide 206 and the pad nitride 208 are preferably stripped at this processing stage.

Figure 9:
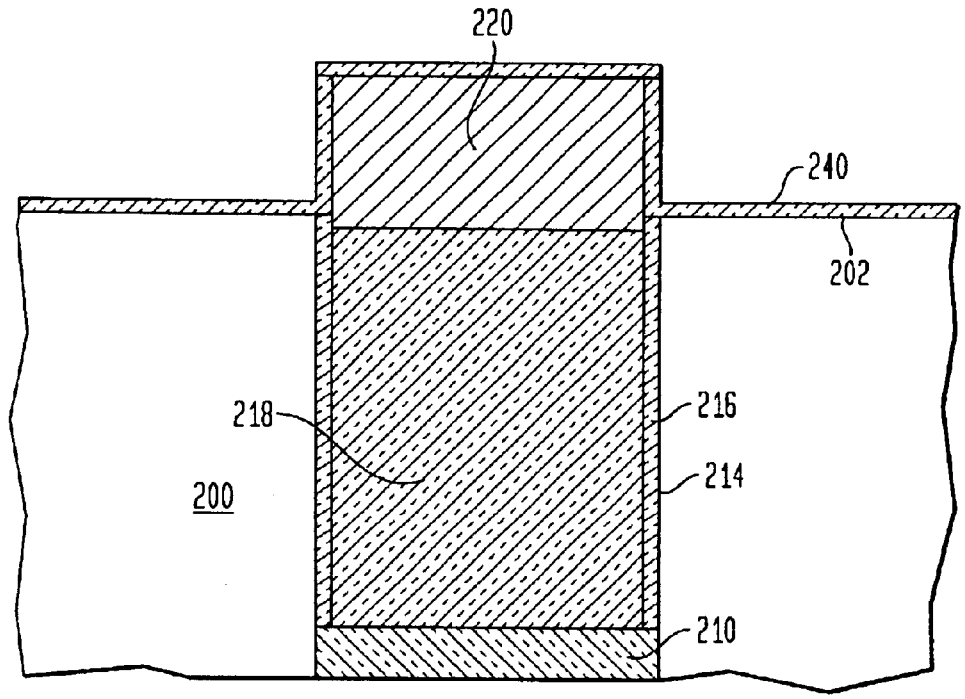
FIG. 9 is a schematic cross-sectional illustration at a subsequent step in a present process of fabricating a semiconductor device.
Figure 10:
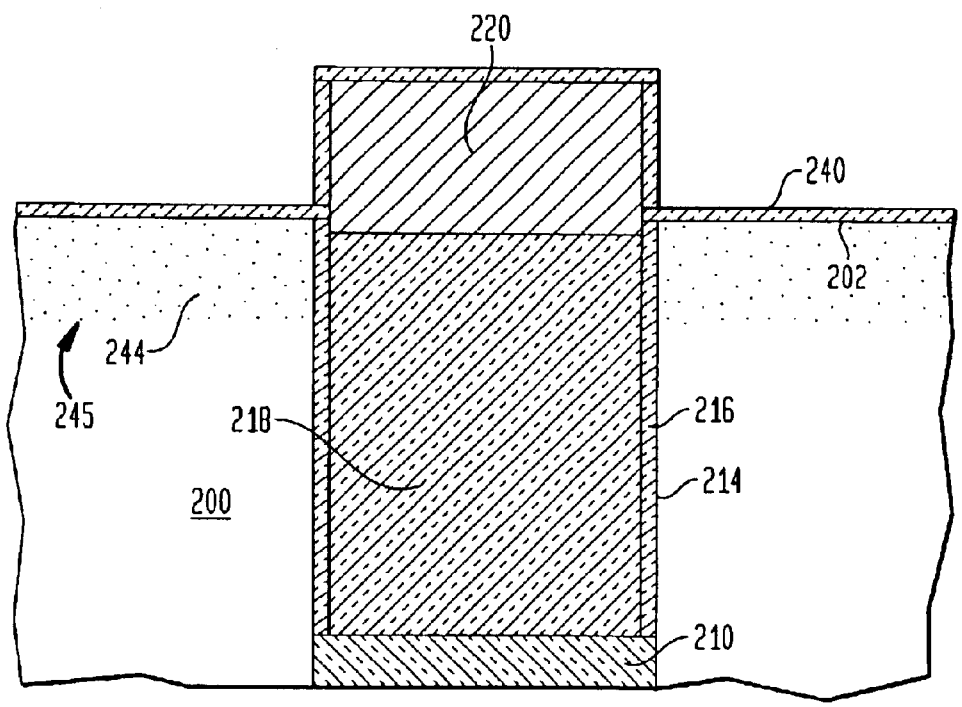
FIG. 10 is a schematic cross-sectional illustration at a further step in a present process of fabricating a semiconductor device.

FIG. 9 illustrates the result of a subsequent fabrication step. A screen oxide 240 is preferably formed over the surface 202 and along the sides of the gate material 218/gate stud 220. Preferably, the screen oxide 240 is grown by a wet oxidation process such as thermal oxidation. Then, as shown in FIG. 10, the source (or drain) regions 244 may be implanted through the screen oxide 240 in the substrate 200. The source regions 224 extend from the surface 202 of the semiconductor substrate 200 to a lower surface 245 within the semiconductor substrate 200. The source regions 244 are preferably part of adjacent transistors which may operate simultaneously.

Figure 11:
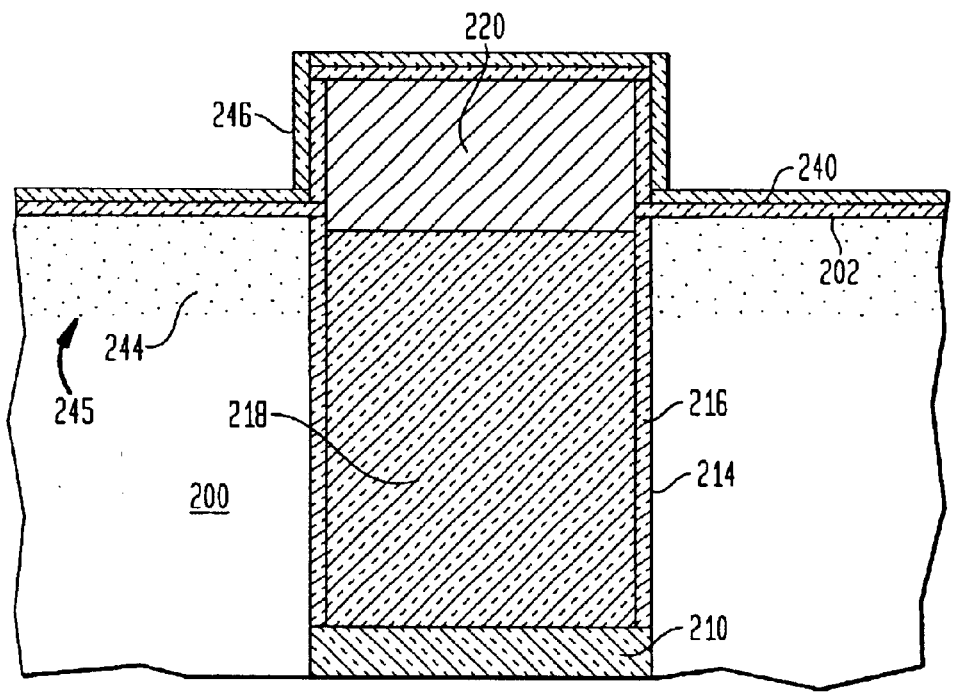
FIG. 11 is a schematic cross-sectional illustration at a subsequent step in a present process of fabricating a semiconductor device.
Figure 12:
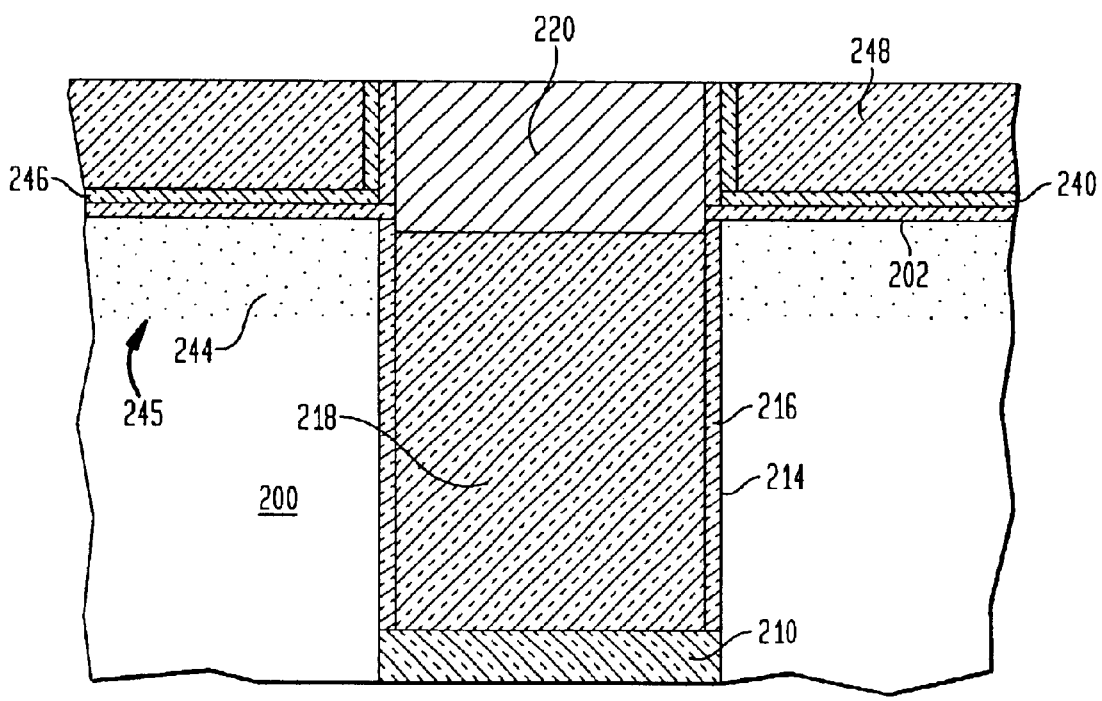
FIG. 12 is a schematic cross-sectional illustration at a further step in a present process of fabricating a semiconductor device.

After the source region 244 is formed, a liner 246 may be deposited over the screen oxide 240, as shown in FIG. 11. The liner 246 is preferably a nitride liner, and may be deposited using LPCVD. After the liner 246 is deposited, an ATO 248 may be formed, as shown in FIG. 12.

Figure 13:
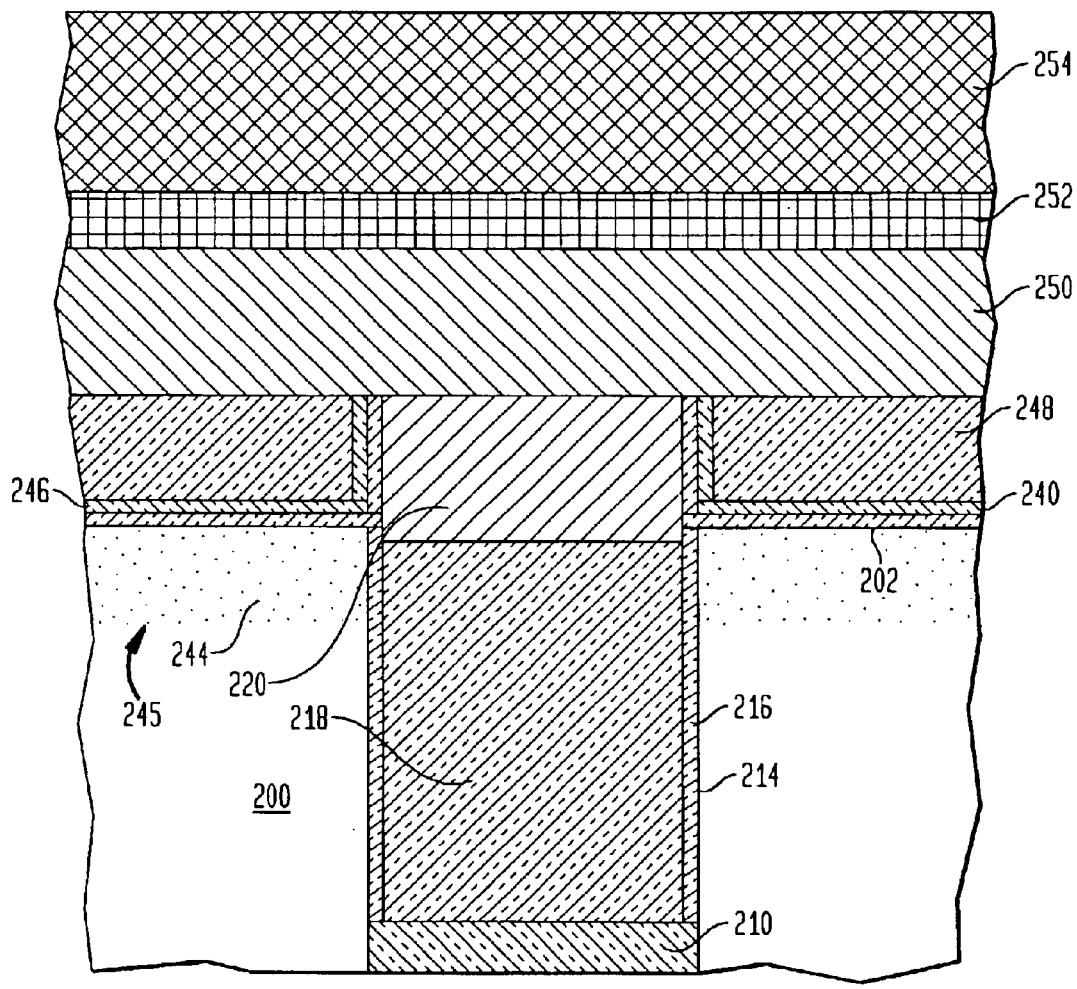
FIG. 13 is a schematic cross-sectional illustration at a subsequent step in a present process of fabricating a semiconductor device.

Next, connections to the gate region may be formed as shown in FIG. 13. A gate conductor 250 is preferably deposited over the wafer. Preferably, the gate conductor 250 comprises poly-Si. The gate conductor 250 and the gate material 218 may or may not comprise the same material. A silicate 252 is then preferably formed over the gate, conductor 250. The silicate 252 is preferably tungsten silicate (WSi). A cap 254 may then be formed over the silicate 252. The cap is preferably nitride, and serves to isolate the silicate 252 from the self aligned bit line contact that is formed during subsequent processing.

Figure 14:
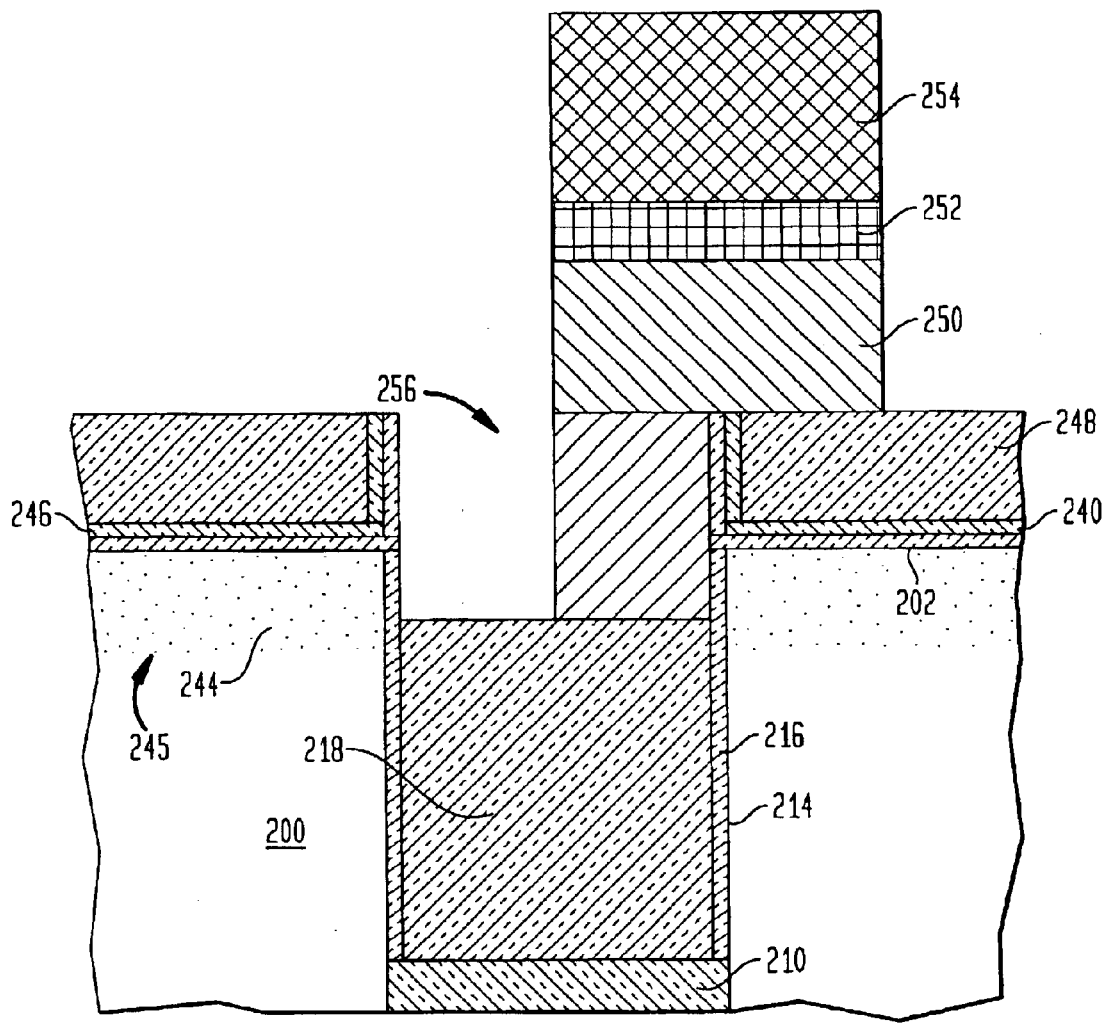
FIG. 14 is a schematic cross-sectional illustration of a further step in a present process of fabricating a semiconductor device.

The gate region, including the gate material 218, the gate stud 220, the gate conductor 250, the silicate 252 and the cap 254, may be etched to a desired shape and size, depending upon the process requirements, using a lithographic process as is known in the art. As shown in FIG. 14, the gate region is preferably etched such that a recess 256 is formed. Preferably, the recess 256 does not extend below the bottom of the source region 244. Etching the recess 256 below the bottom of the source region 244 would destroy overlap of the source region 244 and the gate material 218.

Figure 15:
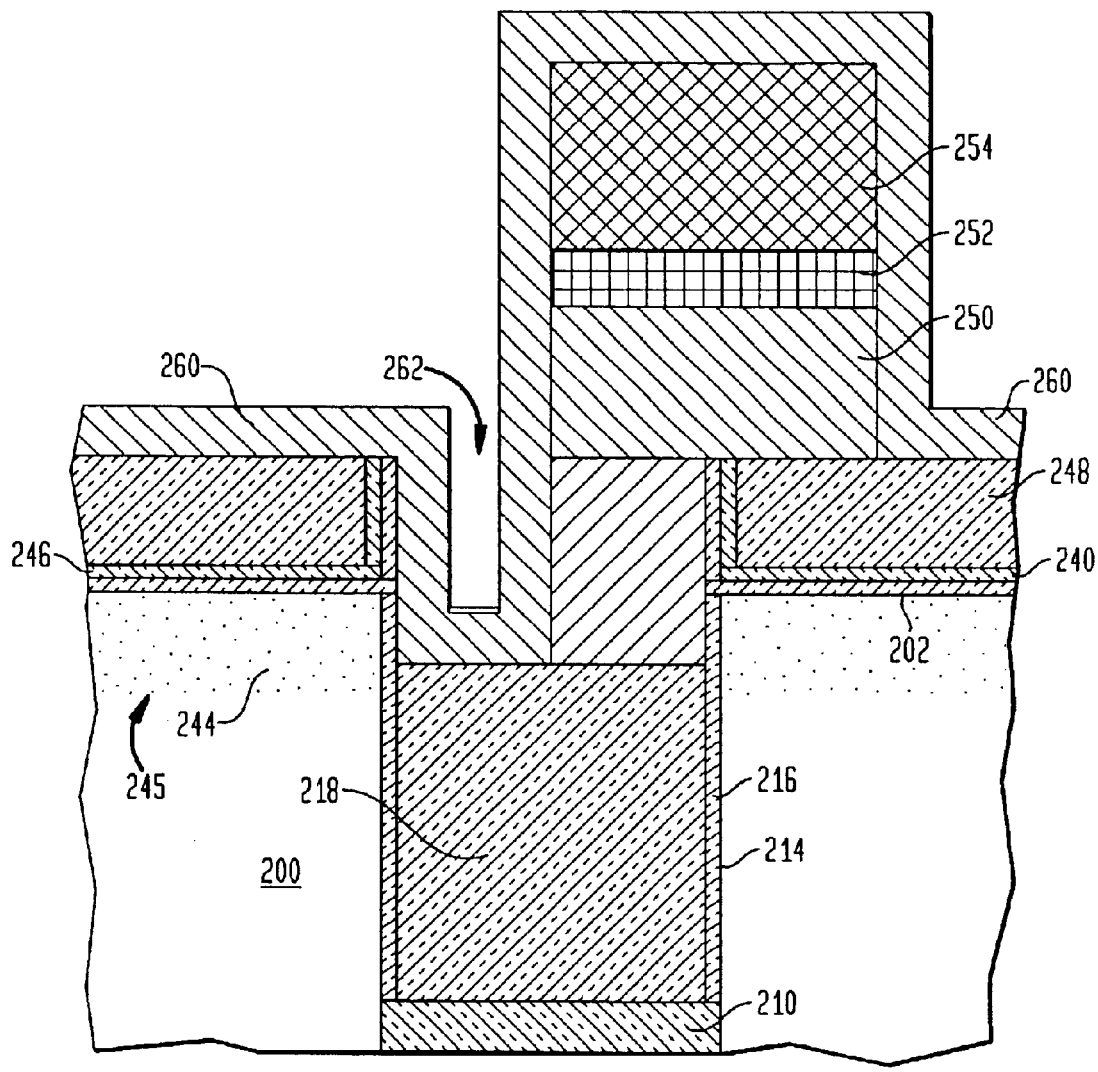
FIG. 15 is a schematic cross-sectional illustration at a further step in a present process of fabricating a semiconductor device.

FIG. 15 illustrates the result of a subsequent step wherein a spacer 260 is formed over the wafer. The spacer 260 is preferably formed by LPCVD. The spacer 260 preferably comprises a nitride. As shown in FIG. 15, the spacer 260 may or may not completely fill the recess 256, and instead leave a gap 262 therein, depending upon misalignment of the gate conductor 250 and the deep trench.

Figure 16:
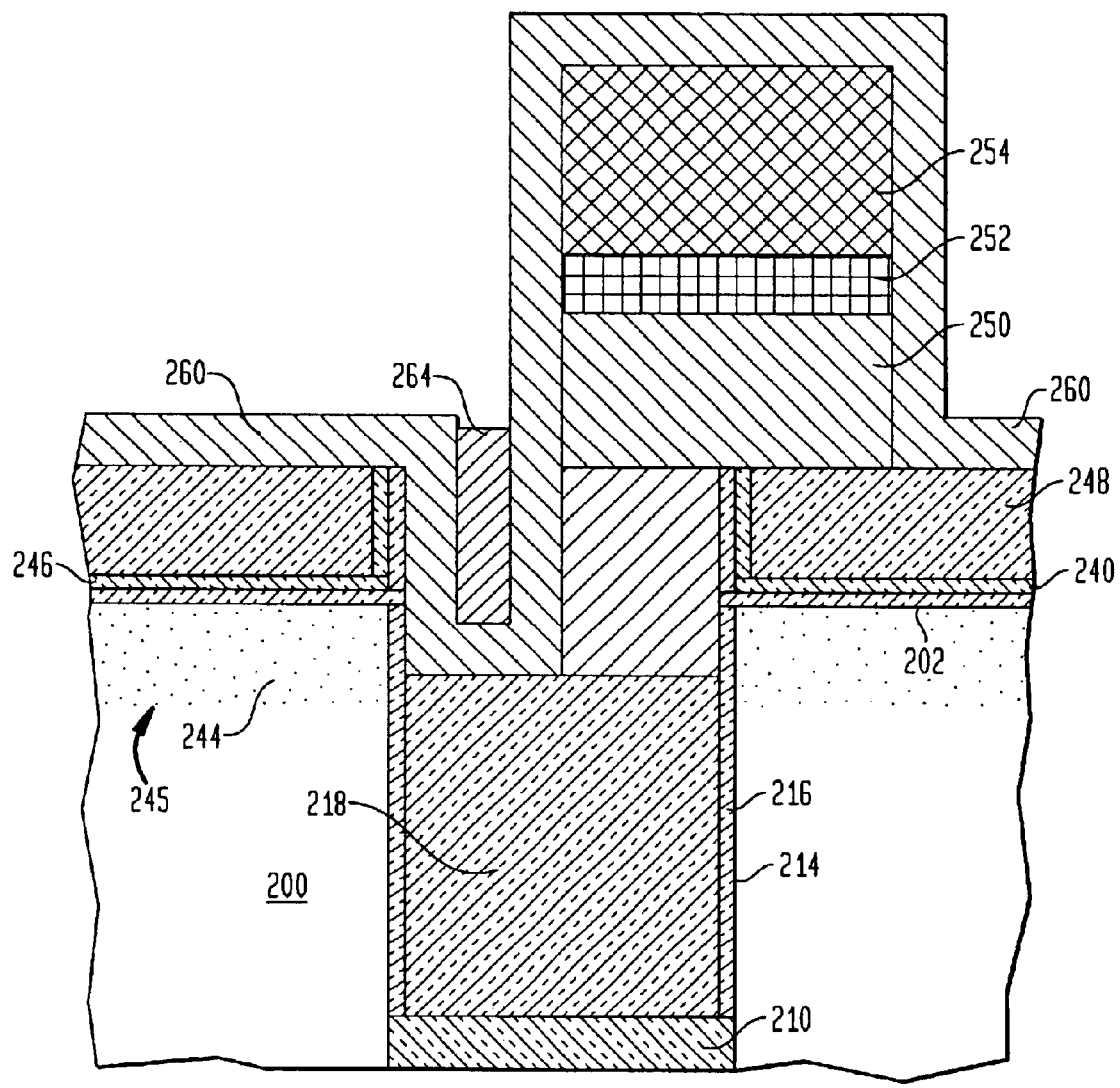
FIG. 16 is a schematic cross-sectional illustration of a subsequent step in a present process of fabricating a semiconductor device.

After a subsequent processing step, a recess fill material 264, as shown in FIG. 16, substantially fills the gap 262. If the spacer 260 is a nitride, the recess fill material 264 is preferably an oxide. Other materials may be employed as well, so long as the spacer 260 is of a different material than the recess fill material 264. The recess fill material 264 is preferably conformally deposited.

Upon formation of the recess fill material 264, it may subsequently be etched back. For example, if the recess fill material 264 is an oxide and the spacer 260 is a nitride, a wet etch that is selective to nitride, such as with an HF-based chemistry, may be performed. After etch back, the recess fill material 264 preferably only remains in the recess but not elsewhere.

Figure 17:
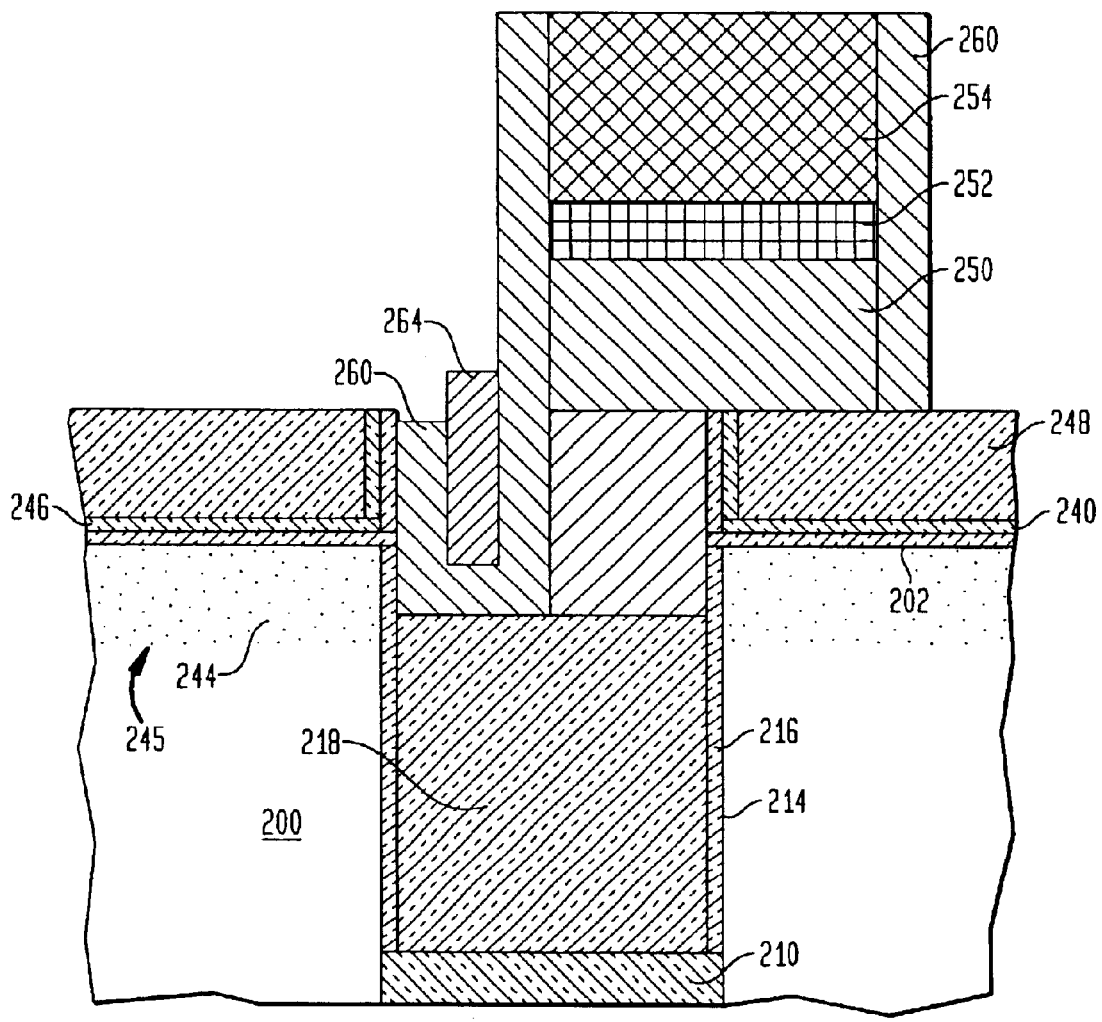
FIG. 17 is a schematic cross-sectional illustration of a further step in a present process of fabricating a semiconductor device.

In a further processing step, a spacer etch may be performed to remove undesired portions of the spacer 260. FIG. 17 illustrates the result of a spacer etch, wherein the spacer 260 is preferably removed from horizontal surfaces. Preferably, the spacer etch is performed using an anisotropic plasma etching process.

The spacer 260 and the recess fill material 264 prevent overetching during formation of the bit line contact, and also prevent a gap, seam or void or case of excessive misalignment between the gate conductor 250 and the trench. The spacer 260 and the recess fill material 264 may also be used to block dopant implants during further process steps. Employing one material for the spacer 260 and a different material for the recess fill material 264 provides control during etching processes.

Figure 18:
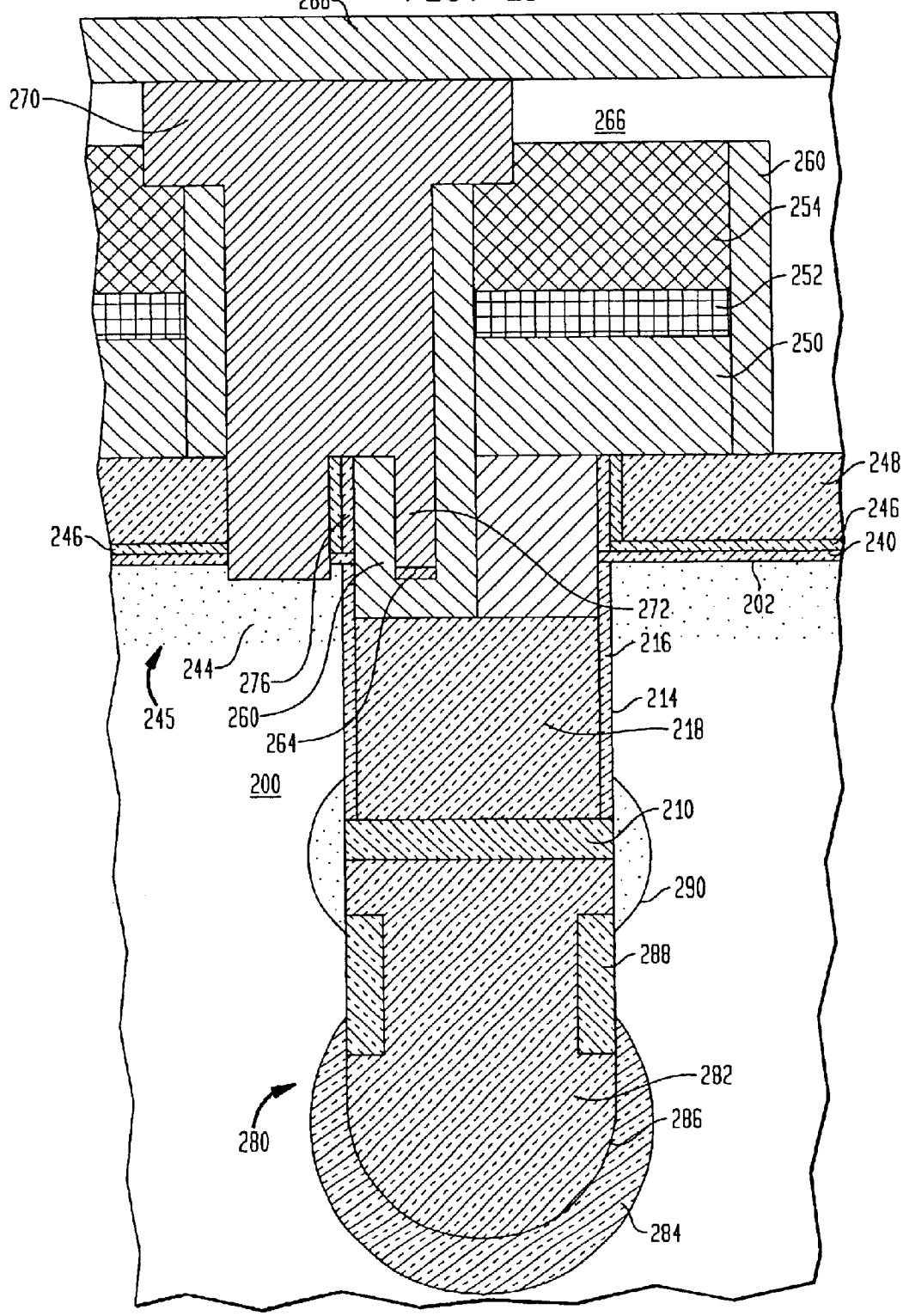
FIG. 18 is a schematic cross-sectional illustration of a subsequent step in a present process of fabricating a semiconductor device.

FIG. 18 is a schematic cross-sectional illustration of another step in the process of fabricating a semiconductor device after connection to a bit line 268. The bit line 268 connects to the source (or drain) region 244 through a bit line contact 270. An isolating material 266 preferably further isolates nearby-bit line contacts 220 from each other and from the gate region. The isolating material 266 may be a dielectric. Preferably, the isolating material is BPSG. The bit line contact 270 may be misaligned with the source region 244, as seen by a portion, 272 of the bit line contact 270. Due to the misalignment, overetching may occur. The recess fill material 264 may be, partly or completely removed during bit line contact 270 formation. However, the spacer 260 prevents the bit line contact etching process from punching through to, e.g., the gate material 218. Thus, the spacer 260 and the recess fill material. 264 prevent punch through of the bit line contact 270. A vertical portion 276 of the screen oxide 240 disposed between the liner 246 and the spacer 260 may be etched during the bit line contact formation process. Because the vertical portion 276 is sandwiched between the liner 246 and the spacer 260, the etch process is retarded, hence providing additional protection against electrical shorts.

FIG. 18 also illustrates an exemplary trench capacitor 280 below the TTO 210. Capacitor fill material 282 is partly surrounded by a collar 288 to isolate it from the substrate 200. Dopant from the capacitor fill material 282 diffuses into diffusion region 290, providing electrical connectivity between the trench capacitor 280 and the transistor of the semiconductor device. The capacitor fill material 282 is the "inner" electrode of the capacitor 280. A "buried plate" 284 is the "outer" electrode of the capacitor 280. A dielectric material 286, the "node dielectric," separates the capacitor fill material 282 from the buried plate 284. The exemplary trench capacitor 280 is merely representative of one type of device which may be formed in conjunction with aspects of the present invention.

An advantage of the present invention is that the spacer 260 and the recess fill material 264, because they are comprised of different materials, provide effective isolation during further process steps. Another advantage of the present invention is that the spacer 260 and the recess fill material 264 can span wide recesses caused, e.g., by misalignment of the gate conductor 250 and the deep trench. Such spanning capability can be beneficial for vertical and planar semiconductor devices, and is much more robust than prior solutions. Thus, the present invention is not limited in use to the semiconductor devices described above. Furthermore, because of the wide spanning capability, the present invention avoids punch-through caused by seams or voids in spacers of prior isolation techniques. A further advantage of the present invention is that the spacer 260 and the recess fill material 264 can block regions of the substrate 200 from dopant implantation, providing enhanced isolation. Yet another advantage of the present invention is the elimination of the deep trench spacer of prior solutions. This reduces processing and provides a corresponding cost benefit.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit of the present invention as defined by the appended claims.

What is claimed is:

1. A semiconductor device, comprising:
   (a) a capacitor formed in a semiconductor substrate; and
   (b) a transistor disposed adjacent to the capacitor, the transistor including:
      (i) a source region in electrical contact with a bit line contact,
      (ii) a drain region in electrical contact with the capacitor,
      (iii) a gate region in electrical contact with a word line,
      (iv) a gate conductor spacer lining a portion of the gate region and having a recess therein, and
      (v) a recess fill material substantially filling the recess, the recess fill material having a different composition than the gate conductor spacer, wherein the gate conductor spacer and the recess fill material are operable to prevent electrical contact between the bit line contact and the gate region.

2. The semiconductor device of claim 1, wherein the gate conductor spacer is a nitride.

3. The semiconductor device of claim 1, wherein the recess fill material is an oxide.

4. The semiconductor device of claim 3, wherein the gate conductor spacer is a nitride.

5. The semiconductor device of claim 1, wherein the recess fill material is conformally deposited within the recess such that no seam or void is formed therein.

6. A semiconductor device, comprising:
   a first material formed in a semiconductor substrate, the first material having an aperture therein;
   a spacer material disposed over at least a portion of the first material including the aperture, the spacer material partly filling the aperture and having a recess therein;
   a further material layer spanning and substantially filling the recess, the further material layer having a different composition than the spacer material; and
   a second material partly disposed over the first material such that the spacer material and the further material layer provide isolation between the first material and the second material.

7. The semiconductor device of claim 6, wherein the spacer material is a nitride.

8. The semiconductor device of claim 6, wherein the further material layer is an oxide.

9. The semiconductor device of claim 8, wherein the spacer material is a nitride.

* * * * *